US012677637B2

(12) United States Patent (10) Patent No.: US 12,677,637 B2
Lee (45) Date of Patent: Jul. 7, 2026

(54) SUBSTRATE SUPPORT ASSEMBLY FOR SUBSTRATE TREATMENT APPARATUS

(71) Applicant: DEVICE CO., LTD., Chungcheongnam-do (KR)

(72) Inventor: Taek Youb Lee, Cheonan-si (KR)

(73) Assignee: DEVICE CO., LTD., Chungcheongnam-do (KR)

( * ) Notice: Subject to any disclaimer, the term of this patent is extended or adjusted under 35 U.S.C. 154(b) by 335 days.

(21) Appl. No.: 18/423,578

(22) Filed: Jan. 26, 2024

(65) Prior Publication Data

US 2025/0054802 A1 Feb. 13, 2025

(30) Foreign Application Priority Data

Aug. 8, 2023 (KR) ........................ 10-2023-0103732

(51) Int. Cl.
H10P 72/76 (2026.01)
(52) U.S. Cl.
CPC ................................ H10P 72/7612 (2026.01)
(58) Field of Classification Search
CPC ...... H10P 72/50; H10P 72/76; H10P 72/7604; H10P 72/7606; H10P 72/7608; H10P 72/7624

USPC ......................................................... 254/104
See application file for complete search history.

(56) References Cited

U.S. PATENT DOCUMENTS

2023/0062042 A1 3/2023 Lee

FOREIGN PATENT DOCUMENTS

JP 9107023 A 4/1997
KR 1020160117300 A 10/2016

*Primary Examiner* — Orlando E Aviles
*Assistant Examiner* — Aaron R Mcconnell
(74) *Attorney, Agent, or Firm* — BLANK ROME LLP

(57) ABSTRACT

The present disclosure relates to a substrate support assembly for a substrate treatment apparatus, including: a chuck base disposed to face a substrate, when the substrate is installed, and rotatable around a rotational axis; chuck pins protruding from top of the chuck base to hold or separate the substrate thereonto or therefrom; a mechanism being connected to the chuck pins; and driving parts for driving the mechanism, wherein the mechanism may include: first operating parts each having a pusher cam movable ascendably/descendably and restorably in a direction of the rotational axis; a second operating part interlocking with the pusher cams in such a way as to reciprocatingly rotate around the rotational axis; and first restoring members each connecting the chuck base and the second operating part to each other.

7 Claims, 8 Drawing Sheets

(a)

(b)

(a)                                                        (b)

SUBSTRATE SUPPORT ASSEMBLY FOR SUBSTRATE TREATMENT APPARATUS

CROSS REFERENCE TO RELATED APPLICATION OF THE DISCLOSURE

The present application claims the benefit of Korean Patent Application No. 10-2023-0103732 filed in the Korean Intellectual Property Office on Aug. 8, 2023, the entire contents of which are incorporated herein by reference.

BACKGROUND OF THE DISCLOSURE

Field of the Disclosure

The present disclosure relates to a substrate support assembly for a substrate treatment apparatus, and more specifically to a substrate support assembly for a substrate treatment apparatus that is capable of rotating a substrate in a state of supporting the substrate so as to perform semiconductor fabrication processes such as cleaning, and the like.

Background of the Related Art

Generally, a substrate treatment apparatus is an apparatus that performs, with the use of treatment liquids, various processes such as deposition, photolithography, etching, and cleaning for substrates such as semiconductor wafers, substrates for display, optical disk substrates, magnetic disk substrates, photomask substrates, ceramic substrates, solar cell substrates, and the like.

Among the processes, the cleaning process is performed to remove foreign substances or particles from the substrate, and representatively, treatment liquid is supplied to top or underside of a substrate to perform the cleaning process for the substrate, while the substrate is rotating at a high speed in a state of being supportedly placed on top of a chuck base (spin head).

In the case of such a rotary type substrate cleaning apparatus, generally, chuck pins are disposed on top of the chuck base in a circumferential direction of the chuck base to prevent the substrate from escaping from the chuck base in a lateral direction of the chuck base during the rotation of the chuck base.

Generally, the substrate treatment apparatus includes a mechanism for driving the chuck pins and driving parts for driving the mechanism. In the case where the substrate rotates, the chuck pins hold the substrate, and contrarily, in the case where the substrate is initially located on the chuck base or unloaded from the chuck base, the substrate is kept in a separated state from the chuck pins.

That is, the chuck pins are configured to move or rotate between a holding position where the substrate is held onto top of the chuck base and a releasing position where the substrate is separated from the chuck base.

The chuck base, the chuck pins, the mechanism, and the driving parts constitute the substrate support assembly for the substrate treatment apparatus.

SUMMARY OF THE DISCLOSURE

Accordingly, the present disclosure has been made in view of the above-mentioned problems occurring in the related art, and it is an object of the present disclosure to provide a substrate support assembly for a substrate treatment apparatus that is capable of allowing chuck pins to stably rotate to hold and release a substrate thereon and therefrom and providing excellent durability.

To accomplish the above-mentioned objects, according to the present disclosure, there is provided a substrate support assembly for a substrate treatment apparatus, including: a chuck base disposed to face a substrate, when the substrate is installed, and rotatable around a rotational axis; chuck pins protruding from top of the chuck base to hold or separate the substrate thereonto or therefrom; a mechanism being connected to the chuck pins; and driving parts for driving the mechanism, wherein the mechanism may include: first operating parts each having a pusher cam movable ascendably/descendably and restorably in a direction of the rotational axis by means of the corresponding driving part; a second operating part interlocking with the pusher cams performing the ascending/descending movements in such a way as to reciprocatingly rotate around the rotational axis; and first restoring members each connecting the chuck base and the second operating part to each other in such a way as to allow the second operating part to be restored, whereby as the second operating part reciprocatingly rotates, the chuck pins interlocking with the second operating part may reciprocatingly rotate in place.

According to the present disclosure, desirably, the mechanism may include: a guide roller rotatably located on the second operating part in such a way as to allow one side surface thereto to face the outer peripheral surface of the second operating part and a slant guide surface formed on top of the pusher cam to allow the outer peripheral surface of the guide roller to come into contact therewith.

According to the present disclosure, desirably, the second operating part may have a rack gear on the inner peripheral surface thereof, and each chuck pin may have a pinion gear formed on the outer peripheral surface thereof in such a way as to interlock with the rack gear.

According to the present disclosure, desirably, the second operating part may have the shape of a ring, and the rack gear may be formed on a stopper protruding outward from the ring-shaped second operating part.

According to the present disclosure, desirably, the mechanism may include a moving roller rotatably located on the second operating part in such a way as to allow one side surface thereto to face the outer peripheral surface of the second operating part, and the moving roller may protrude from top of the second operating part in such a way as to come into contact with the chuck base and move therealong.

According to the present disclosure, desirably, the first operating part may include: a pair of guide rods disposed extending up and down in the chuck base in such a way as to be spaced apart from each other in a circumferential direction of the chuck base with respect to the rotational axis; the pusher cam movable up and down by means of the pair of guide rods and having the slant guide surface formed on top thereof in such a way as to become increased in height in a restoring direction of the second operating part when the second operating part is restored by means of the first restoring member; and second restoring members disposed along the outer peripheral surfaces of the guide rods over a space between the chuck base and the pusher cam.

According to the present disclosure, desirably, the chuck base may include: a chuck support part having the shape of a plate extending in a horizontal direction thereof; and an accommodation portion formed along the outer periphery of the chuck support part in such a way as to accommodate the mechanism and allow the chuck pins to be located on top thereof.

BRIEF DESCRIPTION OF THE DRAWINGS

The above and other objects, features and advantages of the present disclosure will be apparent from the following detailed description of the embodiments of the disclosure in conjunction with the accompanying drawings, in which.

DETAILED DESCRIPTION OF THE PREFERRED EMBODIMENT

Hereinafter, an embodiment of the present disclosure will be explained in detail with reference to the attached drawings.

Figure 1:
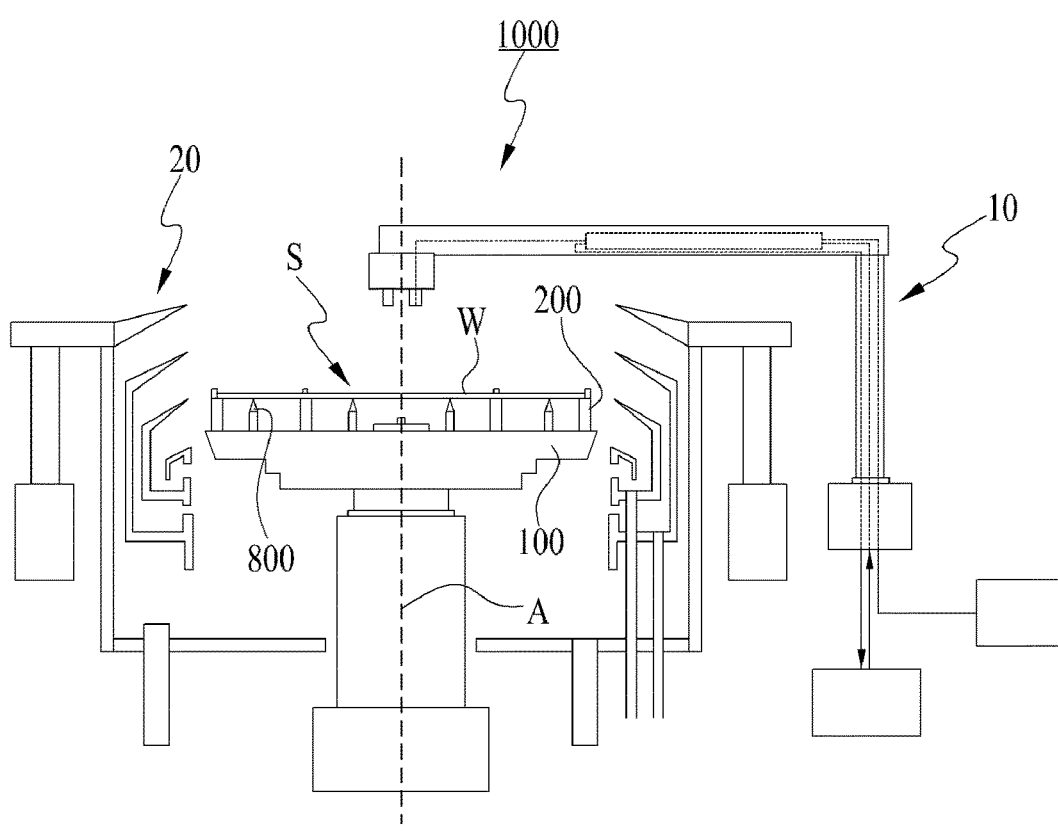
FIG. 1 is a side sectional view showing a substrate treatment apparatus mounted with adopted in a substrate support assembly according to the present disclosure.

As shown in FIG. 1, a substrate treatment apparatus 1000, which is adopted in the present disclosure, includes a fluid supply unit 10, a bowl assembly 20, and a substrate support assembly S.

The fluid supply unit 10 supplies treatment fluids for treating a substrate W to the substrate W.

The substrate support assembly S serves to rotate the substrate W in a state of supporting the substrate W, while a given treatment is being carried out.

The bowl assembly 20 serves to guide and discharge chemical liquids used for treatments and fumes generated during the treatments to thus prevent the chemical liquids and fumes from scattering or flowing to the outside and has a stacked structure of bowls so that different types of chemical liquids and fumes are distinguishedly introduced thereinto according to the relatively heights of the bowls with respect to the substrate W.

As shown in FIGS. 1 to 4, the substrate support assembly S includes a chuck base 100 disposed to face the substrate W, when the substrate W is installed, and rotatable around a rotational axis A, chuck pins 200 protruding from top of the chuck base 100 to hold or separate the substrate W thereonto or therefrom, a mechanism 300 being connected to the chuck pins 200, and driving parts 400 for driving the mechanism 300.

Generally, the substrate support assembly S includes support pins 800 disposed on top of the chuck base 100 to support the substrate W so that the substrate W is prevented from deformedly sagging.

Each chuck pin 200 includes a chuck pin body 210 and a substrate holding piece 220 disposed on top of the chuck pin body 210.

Figure 2:
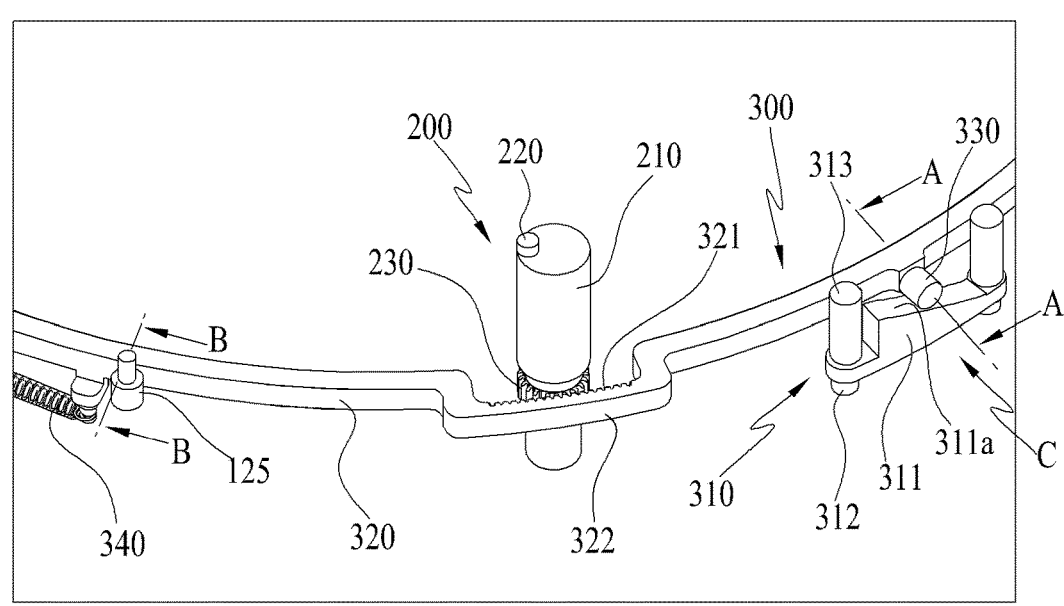
FIG. 2 is a perspective view showing a portion of a mechanism being connected to chuck pins in the substrate support assembly for a substrate treatment apparatus according to the present disclosure.
Figure 7:
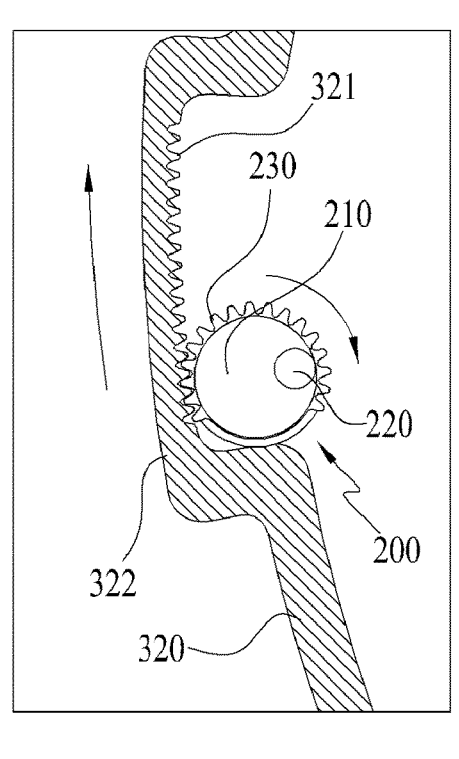
FIGS. 7(a) and 7(b) are plan sectional views showing interlocking examples between a second operating part and the chuck pin in the substrate support assembly according to the present disclosure.
Figure 7:
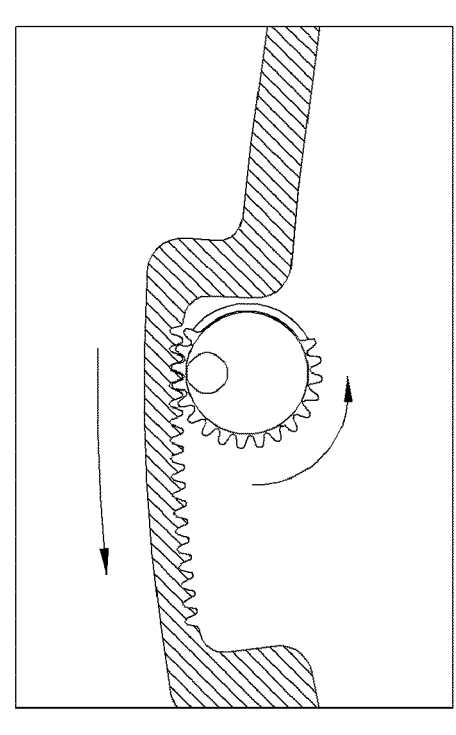
Figure 8:
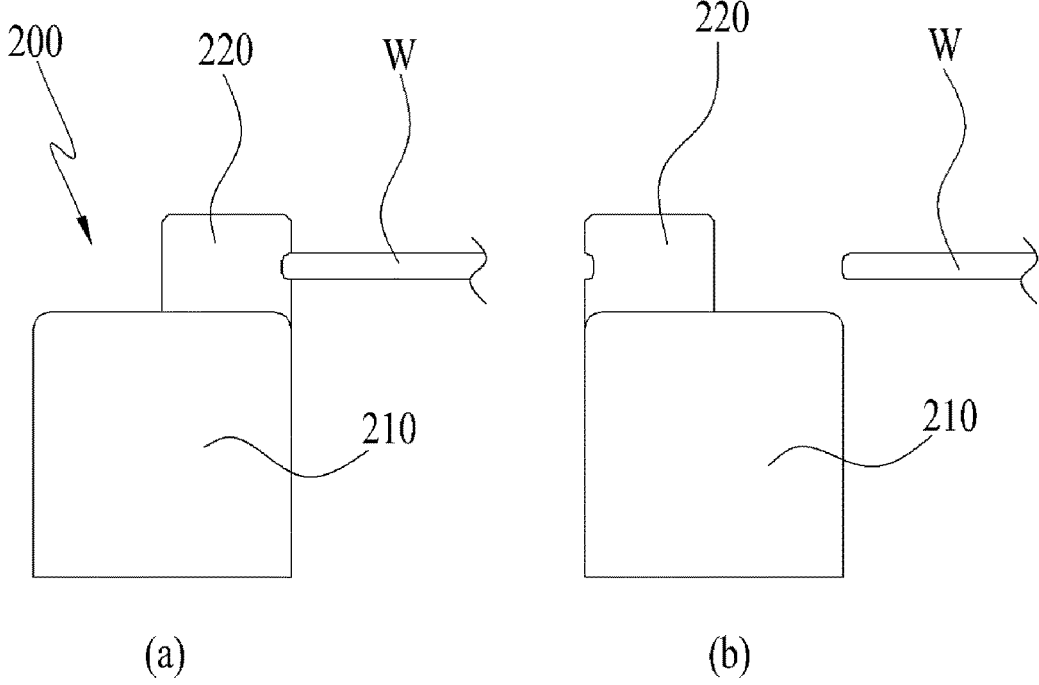
FIGS. 8(a) and 8(b) are side sectional views showing use examples where the substrate is fixed or released by means of the chuck pin in the substrate support assembly according to the present disclosure.

As shown in FIGS. 2 and 7(a) and 8(b), when viewed in plan view, the substrate holding piece 220 is disposed eccentrically from the center of the chuck pin body 210, and while the chuck pin body 210 is rotating, the substrate holding piece 220 becomes close to the substrate W and thus holds the substrate W. If the chuck pin body 210 rotates additionally in any one direction to cause the substrate holding piece 220 to escape from the substrate W, the substrate W is separated from the substrate holding piece 220.

The substrate holding piece 220 can have a mounting groove formed thereon to insert the outer peripheral surface of the substrate W.

The mechanism 300 includes first operating parts 310 each having a pusher cam 311 movable ascendably/descendably and restorably in a direction of the rotational axis A by means of the corresponding driving part 400, a second operating part 320 interlocking with the ascending/descending movements of the pusher cams 311 in such a way as to reciprocatingly rotate around the rotational axis A, and first restoring members 340 for connecting the chuck base 100 and the second operating part 320 in such a way as to allow the second operating part 320 to be restored.

As the second operating part 320 rotates, the chuck pins 200 interlocking with the second operating part 320 rotate in place to allow the substrate W to be separated therefrom.

Further, the mechanism 300 includes a guide roller 330 rotatably located on the second operating part 320 in such a way as to allow one side surface thereto to face the outer peripheral surface of the second operating part 320, and each pusher cam 311 has a slant guide surface 311a formed on top thereof to allow the outer peripheral surface of the guide roller 330 to come into contact therewith.

Figure 3:
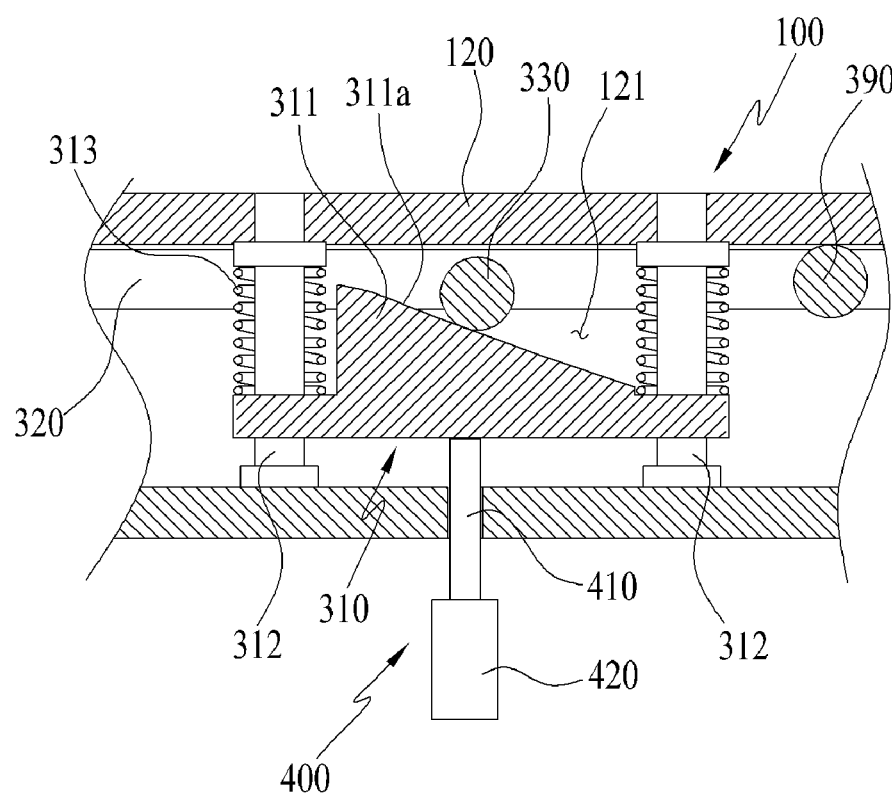
FIG. 3 is a side sectional view showing a coupling structure of a first operating part seen in a direction of C of FIG. 2.
Figure 4:
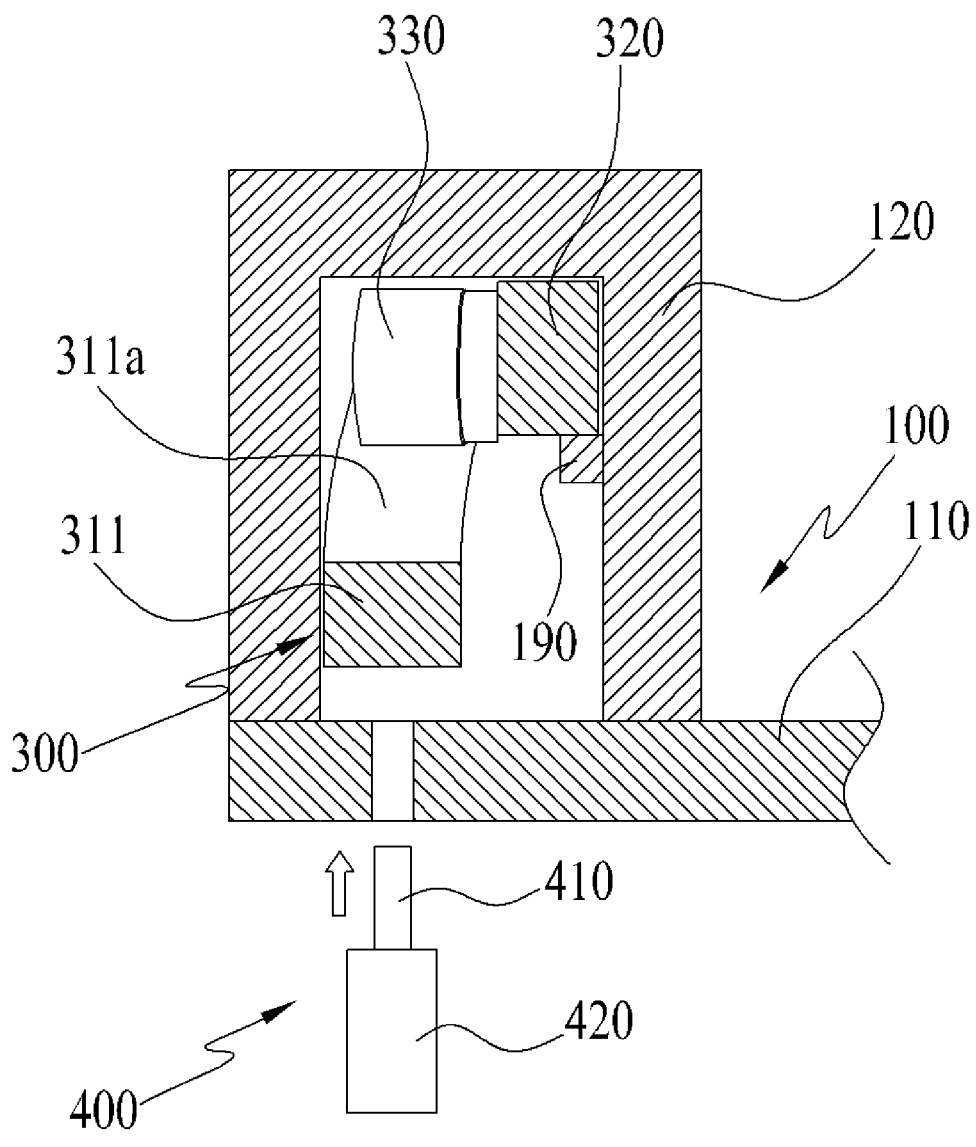
FIG. 4 is a cross-sectional view taken along the line A-A of FIG. 2, wherein a coupled structure among the mechanism, a driving part, and a chuck base is shown.

Under such a configuration, as shown in FIGS. 3 and 4, if the driving part 400 pushes to move the pusher cam 311 up, the slant guide surface 311a formed on top of the pusher cam 311 applies an upward load to the guide roller 330, and accordingly, the guide roller 330 whose upward movement is limited moves along the slant guide surface 311a, so that the second operating part 320 to which the guide roller 330 is connected rotates around the rotational axis A.

In this case, as shown in FIG. 3, the mechanism 300 includes a moving roller 390 rotatably located on the second operating part 320 in such a way as to allow one side surface thereto to face the outer peripheral surface of the second operating part 320, and the moving roller 390 protrudes from top of the second operating part 320 in such a way as to come into contact with the chuck base 100 and move therealong.

That is, the moving roller 390 protruding from the second operating part 320 comes into contact with the surface of the chuck base 100 and moves therealong, thereby avoiding the resistance caused by friction.

As shown in FIGS. 2, 7(a) and 7(b), the second operating part 320 has a rack gear 321 formed on the inner peripheral surface thereof, and each chuck pin 200 has a pinion gear 230 formed on the outer peripheral surface thereof in such a way as to interlock with the corresponding rack gear 321.

When the second operating part 320 reciprocatingly rotates around the rotational axis A, the chuck pin 200 reciprocatingly rotates in place.

Accordingly, the substrate W is held and released onto and from the chuck pins 200 in more stable and reliable ways.

Further, connected operations are performed through the linear movement of the pusher cam 311 and the rotating interlocking between the rack gear 321 and the pinion gear 230, thereby achieving excellent durability.

As shown in FIG. 3, the first operating part 310 includes a pair of guide rods 312 disposed extending up and down in the chuck base 100 in such a way as to be spaced apart from each other in a circumferential direction of the chuck base 100 with respect to the rotational axis A, the pusher cam 311 movable up and down by means of the pair of guide rods 312 and having the slant guide surface 311*a* formed on top thereof in such a way as to become increased in height in a restoring direction of the second operating part 320 when the second operating part 320 is restored by means of the first restoring member 340, and second restoring members 313 disposed along the extending direction of the guide rods 312 over a space between the chuck base 100 and the pusher cam 311.

One or more first operating parts 310 may be disposed in the circumferential direction of the second operating part 320.

If so, they are equally spaced apart from one another, which enables the second operating part 320 to rotate more stably.

The slant guide surface 311*a* may be a linear slant surface or gently curved surface.

That is, only if the guide roller 330 naturally moves on the slant guide surface 311*a*, without any difficulty, the slant guide surface 311*a* may be changed in shape.

When viewed in plan view, the pusher cam 311 desirably extends to the shape of an arch, which is desirable in guiding the guide roller 330, but the pusher cam 311 does not need to be limited in shape.

The second restoring members 313 as compression springs disposed around the guide rods 312 are shown, but various types of known springs such as leaf springs may be used as the second restoring members 313.

As shown in FIG. 2, the second operating part 320 has the shape of a ring, and the rack gear 321 is formed on a stopper 322 protruding outward from the ring-shaped second operating part 320. After the second operating part 320 rotates to a given extent, the rack gear 321 is locked onto the chuck pin 200 so that desirably, the second operating part 320 is limited in movement around the rotational axis A.

However, the second operating part 320 does not need to be necessarily circular. That is, only a portion of the second operation part 320 where the rack gear 321 is formed is circular, and the remaining portion thereof may be differently formed in shape.

If the second operating part 320 is circular, it can be considered that the second operating part 320 has the stopper 322 protruding outward therefrom in a radial direction thereof.

Further, the second operating part 320 desirably has the shape of a ring, but it may be divided into a plurality of parts so that the divided parts may be connected to one another by means of appropriate connectors.

As shown in FIGS. 7(*a*) and 7(*b*), the bottom of the stopper 322 on which the rack gear 321 is formed has the shape of an arch around the rotational axis A, but the bottom of the stopper 322 may be appropriately curved or even linearly formed if a moving distance thereof is short.

Figure 6:
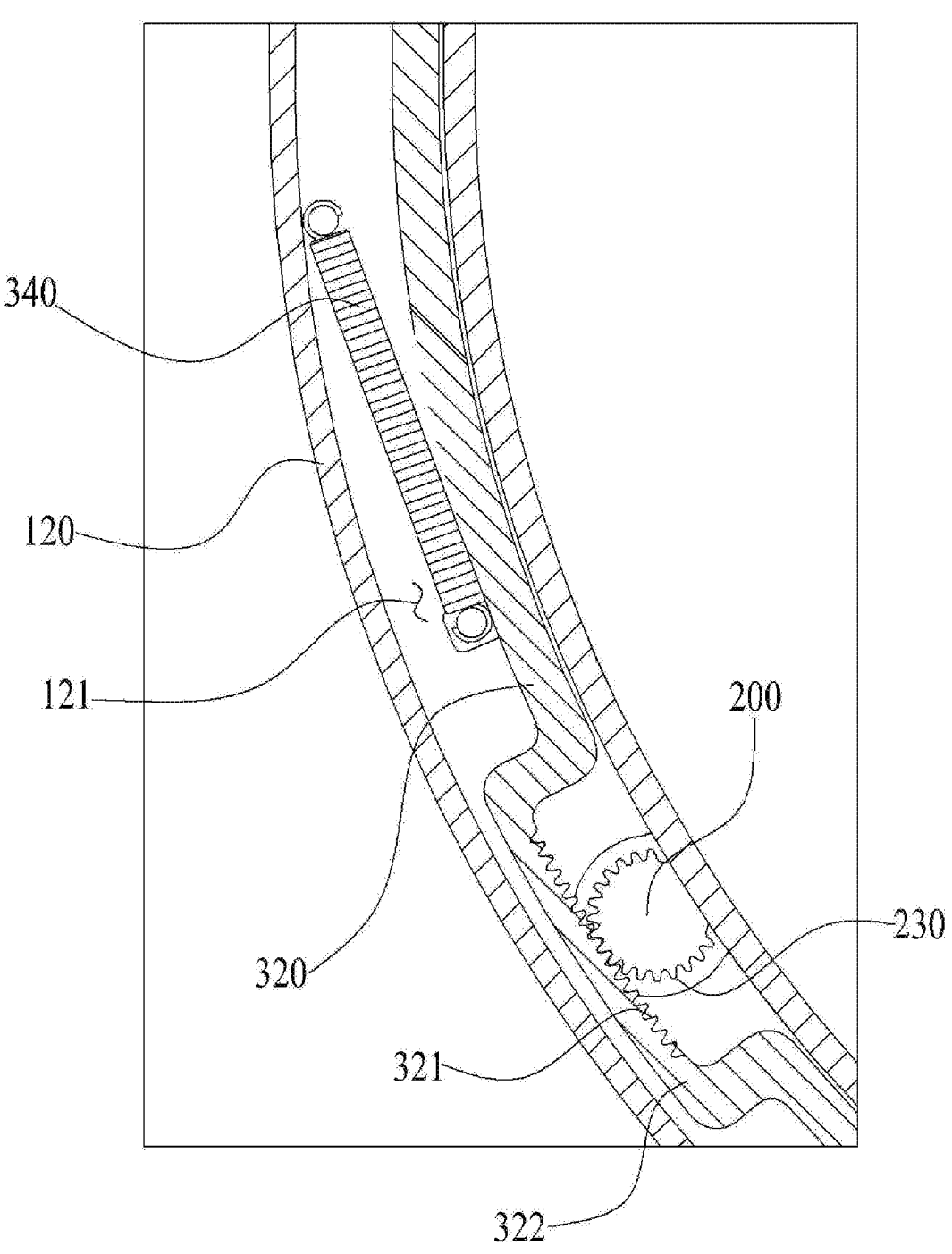
FIG. 6 is a sectional view showing the underside of a portion of the coupled structure between the mechanism being connected to the chuck pins and the chuck base in the substrate support assembly according to the present disclosure.

As shown in FIG. 6, the first restoring member 340 is disposed between the chuck base 100 and the second operating part 320. Normally, the first restoring member 340 applies a restoring force to the second operating part 320 so that the substrate W is held onto the chuck pins 200, and if the driving parts 400 operate, the second operating part 320 is resistant to the restoring force and thus moved by means of the mechanism 300 so that the substrate W is separated from the chuck pins 200.

One or more first restoring members 340 may be disposed in the circumferential direction of the second operating part 320.

If so, they are equally spaced apart from one another, which enables the second operating part 320 to restoringly move, without any difficulty.

When viewed in plan view, the first restoring member 340 is a tension spring disposed along the outer peripheral surface of the second operating part 320 (In this case, the tension spring does not need to be parallel to the outer peripheral surface of the second operating part 320), but a variety of known springs such as leaf springs, compression springs, and the like may be used as the first restoring member 340 according to the arrangement structure of the first restoring member 340.

In the drawings, one first restoring means 340 is disposed between the neighboring first operating parts 310, but such an arrangement does not need to be determined. Further, the plurality of first restoring members 340 do not need to be provided necessarily.

As shown in FIGS. 3 and 4, each driving part 400 includes a pusher pin 410 coming into contact with the corresponding pusher cam 311 of the mechanism 300 and a driving unit 420 connected to the pusher pin 410.

A variety of known units such as a pressure cylinder, a link type press, and the like may be used as the driving unit 420.

The driving part 400 can be fixedly disposed on a fixing frame (not shown) on the outside of the chuck base 100.

However, The driving part 400 can also be installed integrally with the chuck base 100.

Further, the chuck base 100 includes a chuck support part 110 having the shape of a plate extending in a horizontal direction thereof and an accommodation portion 120 formed along the outer periphery of the chuck support part 110 and having an accommodation space portion 121 formed therein to accommodate the mechanism 300 and allow the chuck pins 200 to be located on top thereof.

The chuck support part 110 has the shape of a circular disc, but of course, it may have grooves or protrusions formed on the outer peripheral surface thereof.

Further, the chuck support part 110 does not need to have a constant thickness, and if the grooves or protrusions are formed, the chuck support part 110 may be differently formed in thickness.

Like this, the mechanism 300 can be accommodated into the accommodation portion 120 formed on the outer periphery of the chuck support part 110, thereby enabling the substrate support assembly S to become more compact in configuration and improving the utility in the space around the rotational axis A.

Figure 5:
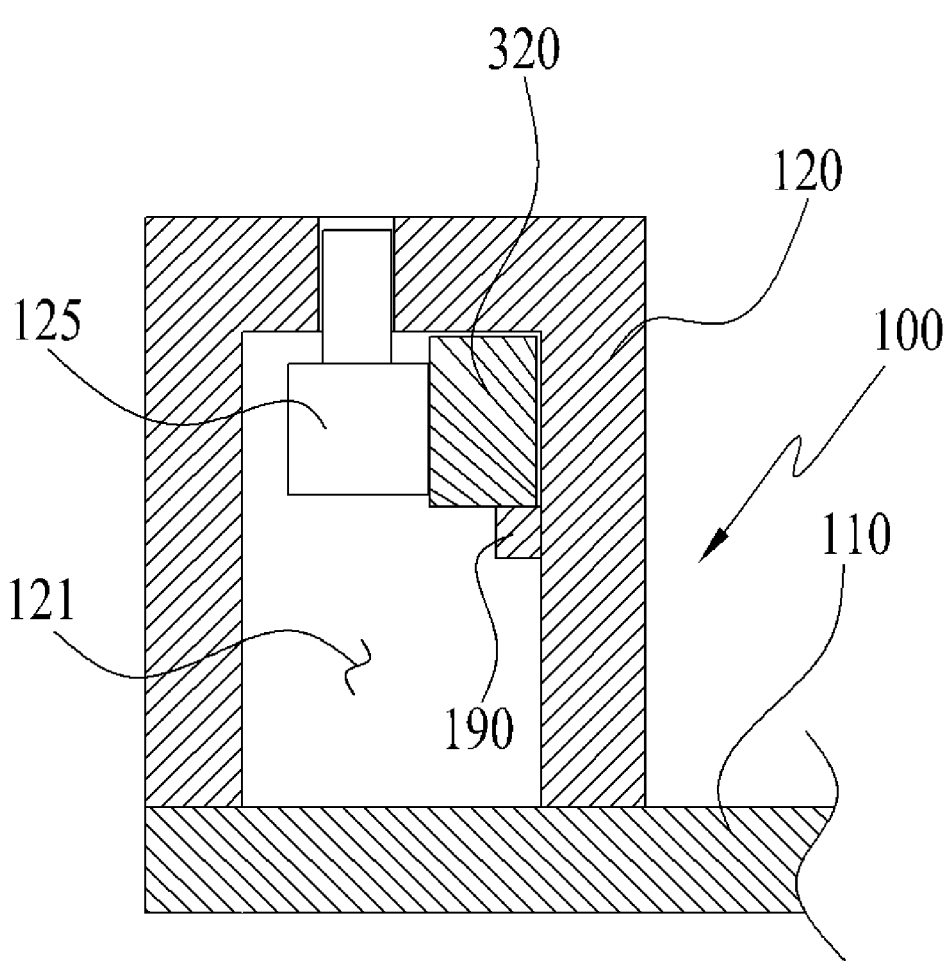
FIG. 5 is a cross-sectional view taken along the line B-B of FIG. 2, wherein a coupled structure between the mechanism and the chuck base is shown.

As shown in FIG. 5, a plurality of rotation guiding rollers 125 are disposed inside the accommodation portion 120 to guide the rotational movement of the outer peripheral surface of the second operating part 320 with respect to the rotational axis A.

Further, as shown in FIGS. 4 and 5, support pieces 190 are disposed inside the accommodation portion 120 to support the underside of the second operating part 320.

In this case, the support pieces 190 do not need to be continuously arranged along the circumferential direction of the second operating part 320 with respect to the rotational axis A, and they are intermittently arranged at given intervals therealong.

As described above, the substrate support assembly for the substrate treatment apparatus according to the present disclosure is configured to allow the slant guide surface formed on top of the pusher cam, if the driving part pushes to move up the pusher cam, to apply an upward load to the guide roller so that the guide roller whose upward movement is limited moves along the slant guide surface to allow the second operating part to rotate around the rotational axis, and accordingly, as the second operating part rotates, the chuck pins rotate in place to allow the substrate to be held and released thereonto and therefrom in more stable and reliable ways.

According to the present disclosure, further, the substrate support assembly for the substrate treatment apparatus is configured to allow the rack gear and the pinion gear to interlockingly rotate by means of the linear movement of the pusher cam so that the corresponding chuck pin rotates, thereby improving structural durability thereof.

According to the present disclosure, moreover, the substrate support assembly for the substrate treatment apparatus is configured to allow the mechanism to have the moving roller rotatably located on the second operating part in such a way as to allow one side surface thereto to face the outer peripheral surface of the second operating part so that the moving roller protrudes from top of the second operating part in such a way as to first come into contact with the chuck base and move therealong, thereby avoiding the resistance generated by friction.

According to the present disclosure, in addition, the substrate support assembly for the substrate treatment apparatus is configured to have the second operating part with the shape of a ring, while the rack gear is being formed on the stopper protruding outward from the ring-shaped second operating part, so that the second operating part is naturally limited in rotation around the rotational axis.

According to the present disclosure, also, the substrate support assembly for the substrate treatment apparatus is configured to have the mechanism accommodated into the accommodation portion formed on the outer periphery of the chuck support part, thereby being more compact in configuration and improving the utility in the space around the rotational axis.

The present disclosure may be modified in various ways and may have several exemplary embodiments. It is therefore intended that the scope of the disclosure be limited not by this detailed description, but rather by the claims appended hereto, and it should be understood that the disclosure covers all the modifications, equivalents, and replacements within the idea and technical scope of the disclosure.

What is claimed is:

1. A substrate support assembly for a substrate treatment apparatus, comprising:

a chuck base disposed to face a substrate, when the substrate is installed, and rotatable around a rotational axis;

chuck pins protruding from top of the chuck base to hold or separate the substrate thereonto or therefrom;

a mechanism being connected to the chuck pins; and driving parts for driving the mechanism, wherein the mechanism comprises:

first operating parts each having a pusher cam with a slant guide surface formed on a top of the pusher cam, the pusher cam movable ascendably/descendably and restorably in a direction of the rotational axis by means of the driving part;

a second operating part interlocking with the slant guide surface of the pusher cams performing the ascending/descending movements in such a way as to reciprocatingly rotate around the rotational axis; and first restoring members each connecting the chuck base and the second operating part to each other in such a way as to allow the second operating part to be restored, whereby as the second operating part reciprocatingly rotates, the chuck pins interlocking with the second operating part reciprocatingly rotate in place.

2. The substrate support assembly according to claim 1, wherein the mechanism comprises:

a guide roller rotatably located on the second operating part in such a way as to allow one side surface thereto to face the outer peripheral surface of the second operating part; and the slant guide surface allows the outer peripheral surface of the guide roller to come into contact therewith.

3. The substrate support assembly according to claim 2, wherein the second operating part has a rack gear on the inner peripheral surface thereof, and each chuck pin has a pinion gear formed on the outer peripheral surface thereof in such a way as to interlock with the rack gear.

4. The substrate support assembly according to claim 3, wherein the second operating part has the shape of a ring, and the rack gear is formed on a stopper protruding outward from the ring-shaped second operating part.

5. The substrate support assembly according to claim 2, wherein the mechanism comprises a moving roller rotatably located on the second operating part in such a way as to allow one side surface thereto to face the outer peripheral surface of the second operating part, and the moving roller protrudes from top of the second operating part in such a way as to come into contact with the chuck base and move therealong.

6. The substrate support assembly according to claim 2, wherein the first operating part comprises:

a pair of guide rods disposed extending up and down in the chuck base in such a way as to be spaced apart from each other in a circumferential direction of the chuck base with respect to the rotational axis;

the pusher cam movable up and down by means of the pair of guide rods and having the slant guide surface formed on top thereof in such a way as to become increased in height in a restoring direction of the second operating part when the second operating part is restored by means of the first restoring member; and second restoring members disposed along the extending direction of the guide rods over a space between the chuck base and the pusher cam.

7. The substrate support assembly according to claim 2, wherein the chuck base comprises:

a chuck support part having the shape of a plate extending in a horizontal direction thereof; and an accommodation portion formed along the outer periphery of the chuck support part in such a way as to accommodate the mechanism and allow the chuck pins to be located on top thereof.

* * * * *